United States Patent
Itoh et al.

(10) Patent No.: US 8,610,353 B2
(45) Date of Patent: Dec. 17, 2013

(54) PLASMA GENERATING APPARATUS, PLASMA PROCESSING APPARATUS AND PLASMA PROCESSING METHOD

(75) Inventors: Hitoshi Itoh, Nirasaki (JP); Hidenori Miyoshi, Nirasaki (JP); Masaru Hori, Nagoya (JP); Hirotaka Toyoda, Nagoya (JP); Makoto Sekine, Nagoya (JP)

(73) Assignees: Tokyo Electron Limited, Tokyo (JP); National University Corporation Nagoya University, Nagoya-shi, Aichi-ken (JP)

(*) Notice: Subject to any disclaimer, the term of this patent is extended or adjusted under 35 U.S.C. 154(b) by 159 days.

(21) Appl. No.: 13/224,879

(22) Filed: Sep. 2, 2011

(65) Prior Publication Data

US 2012/0068603 A1  Mar. 22, 2012

(30) Foreign Application Priority Data

Sep. 16, 2010  (JP) .................................. 2010-207774

(51) Int. Cl.
*H01J 7/24* (2006.01)
*H05B 31/26* (2006.01)

(52) U.S. Cl.
USPC ............ 315/111.21; 315/111.41; 315/111.01; 118/723 MW; 118/723 R; 313/231.31; 156/345.41

(58) Field of Classification Search
USPC .............. 315/111.21; 118/723 R; 156/345.41
See application file for complete search history.

(56) References Cited

U.S. PATENT DOCUMENTS

| | | | | |
|---|---|---|---|---|
| 6,497,783 B1 * | 12/2002 | Suzuki et al. | ............... | 156/345.1 |
| 6,706,141 B1 * | 3/2004 | Steinhardt et al. | ........ | 156/345.41 |
| 6,870,123 B2 * | 3/2005 | Suzuki et al. | ............ | 219/121.43 |
| 7,493,869 B1 | 2/2009 | Foster et al. | | |
| 7,728,251 B2 * | 6/2010 | Ide et al. | .................. | 219/121.43 |
| 8,128,783 B2 * | 3/2012 | Matsuuchi et al. | ....... | 156/345.41 |
| 8,216,433 B2 * | 7/2012 | Yonesu | ..................... | 204/157.43 |
| 8,242,405 B2 * | 8/2012 | Nishimoto | ............... | 219/121.43 |
| 2009/0200910 A1* | 8/2009 | Matsuuchi et al. | ....... | 313/231.31 |

FOREIGN PATENT DOCUMENTS

| | | |
|---|---|---|
| JP | 10-275696 A | 10/1993 |
| JP | 2001-93871 A | 4/2001 |
| JP | 2001-288569 A | 10/2001 |
| JP | 2003-096570 A | 4/2003 |
| JP | 2004-200390 A | 7/2004 |
| JP | 2007-18771 A | 1/2007 |
| JP | 2009-224269 A | 10/2009 |
| JP | 2010-80350 A | 4/2010 |
| KR | 10-2007-0031875 A | 3/2007 |

* cited by examiner

*Primary Examiner* — Daniel Cavallari
*Assistant Examiner* — Srinivas Sathiraju
(74) *Attorney, Agent, or Firm* — Nath, Goldberg & Meyer; Jerald L. Meyer (57) ABSTRACT

An apparatus for generating plasma, comprises: a microwave generator configured to generate a microwave; a wave guide which is connected to the microwave generator, wherein the wave guide is elongated in a traveling direction of the microwave and has a hollow shape having a rectangular section in a direction perpendicular to the traveling direction; a gas feeder which is connected to the wave guide and feeds process gas into the wave guide; and an antenna unit which is a part of the wave guide and discharges plasma generated by the microwave to the outside, wherein the antenna unit has one or more slots formed on a wall constituting a short side in a section of the antenna unit, plasmarizes the process gas fed into the wave guide under an atmospheric pressure in the slots by the microwave, and discharges the plasma out of the slots.

18 Claims, 9 Drawing Sheets

PLASMA GENERATING APPARATUS, PLASMA PROCESSING APPARATUS AND PLASMA PROCESSING METHOD

CROSS-REFERENCE TO RELATED APPLICATION

This application claims the benefit of Japanese Patent Application No. 2010-207774, filed on Sep. 16, 2010, in the Japan Patent Office, the disclosure of which is incorporated herein in its entirety by reference.

TECHNICAL FIELD

The present disclosure relates to an apparatus for generating plasma using a microwave, and an apparatus and a method for plasma processing using the plasma generating apparatus.

BACKGROUND

As microwave plasma processing apparatuses generate plasma of a process gas using a microwave introduced into a processing container, there has been known a low pressure plasma type which generates plasma under a reduced internal pressure of a processing container and an atmospheric pressure plasma type which generates plasma under an atmospheric pressure.

As one example of the low pressure plasma type conventional technique, there has been proposed a plasma processing apparatus in which the arrangement and number of slots formed in the lengthwise direction of a wave guide are defined based on the relationship between a free space wavelength $\lambda$ and a wave guide wavelength $\lambda g$, and in which an impedance within the wave guide when viewed from a microwave power source is approximately equal to an impedance within the wave guide when viewed from its reverse direction. The proposed apparatus is advantageous in that a uniform plasma process can be performed for an object with a large area to be processed, such as a plastic film or the like. However, in the apparatus employing the low pressure plasma type, a dielectric plate is interposed between the wave guide and a processing container in order to keep the processing container at a low pressure. This dielectric plate may be effective in the respect of enhancing uniformity of plasma; however, it deteriorates the efficiency of energy use by absorbing some of the microwave. Accordingly, this leaves room for improvement for the purpose of processing the object with high-density plasma while minimizing energy loss.

In addition, it is effective to feed process gas without partiality for the microwave introduced into the processing container. However, in general, in a structure where the dielectric plate is interposed between the wave guide and the processing container, the process gas has to be directly introduced into the processing container. Moreover, a shower head cannot be formed on a ceiling of the processing container due to the existence of the dielectric plate so that a gas introduction part is limitedly disposed in a position separated from the wave guide (for example, a side wall of the processing container). Since the gas introduction part is restricted as such, it may be difficult to realize plasma uniformity in the processing container and process uniformity in the surface of the object.

As another example of the low pressure plasma type conventional technique, there has been proposed a plasma processing apparatus in which a wave guide propagating a microwave is inserted in a vacuum container. According to the apparatus proposed above, the wave guide is disposed within the vacuum container so that a dielectric member for maintaining a vacuum can be made small and thin, and an object with a large area to be processed can be uniformly processed. However, the apparatus has a double structure where the wave guide is disposed within the vacuum container which requires air-tightness, which may result in a complicated configuration of the apparatus which may make it difficult to realize. In addition, although the apparatus has no dielectric plate, the apparatus has a problem in that it is difficult to achieve plasma uniformity in the processing container and process uniformity on a surface of the object since a gas introduction part is formed on a side wall of the processing container which is separated from the wave guide.

As one example of the atmospheric pressure plasma type conventional technique, there has been proposed a plasma processing apparatus having a plasma generator including a slot antenna, an uniformity line which is connected at a right angle to a slot-formed surface of the slot antenna and brings a microwave into uniformity, and slits which are provided at a leading end of the uniformity line and emits the microwave. The plasma processing apparatus is configured to process an object to be processed, which is placed on the outside of the slits, with plasma under an atmospheric pressure by successively feeding process gas within a gap between the slits and the object to generate the plasma. Although this atmospheric pressure type plasma processing apparatus is advantageous in that it does not require a dielectric plate, it requires the slots for a wave guide and the slits for the uniformity line, and in other words, has a structure where two wave guides and two slots are arranged. Accordingly, this apparatus has a complicated structure and difficulty in controlling transmission of the microwave, and has a possibility of intermediate attenuation of the microwave due to occurrence of reflective wave. Therefore, the apparatus is not satisfactory in the respect of generating plasma with high efficiency.

SUMMARY

The present disclosure provides some embodiments of a plasma generating apparatus which is capable of generating high-density plasma with high efficiency by minimizing a microwave loss.

According to one embodiment of the present disclosure, provided is an apparatus for generating plasma, comprising: a microwave generator configured to generate a microwave; a wave guide which is connected to the microwave generator, wherein the wave guide is elongated in a traveling direction of the microwave and has a hollow shape having a rectangular section in a direction perpendicular to the traveling direction; a gas feeder which is connected to the wave guide and feeds process gas into the wave guide; and an antenna unit which is a part of the wave guide and discharges plasma generated by the microwave to the outside, wherein the antenna unit has one or more slots formed on a wall constituting a short side in a section of the antenna unit, plasmarizes the process gas fed into the wave guide under an atmospheric pressure in the slots by the microwave, and discharges the plasma out of the slots.

According to another embodiment of the present disclosure, provided is an apparatus for plasma processing which comprises the above plasma generating apparatus, wherein the generated plasma is used to perform a predetermined process for an object to be processed.

Additionally, provided is a method for plasma processing which processes an object to be processed using the above plasma processing apparatus.

BRIEF DESCRIPTION OF THE DRAWINGS

The accompanying drawings, which are incorporated in and constitute a part of the specification, illustrate embodi

DETAILED DESCRIPTION

Embodiments of the present disclosure will now be described in detail with reference to the drawings.

First Embodiment

Figure 1:
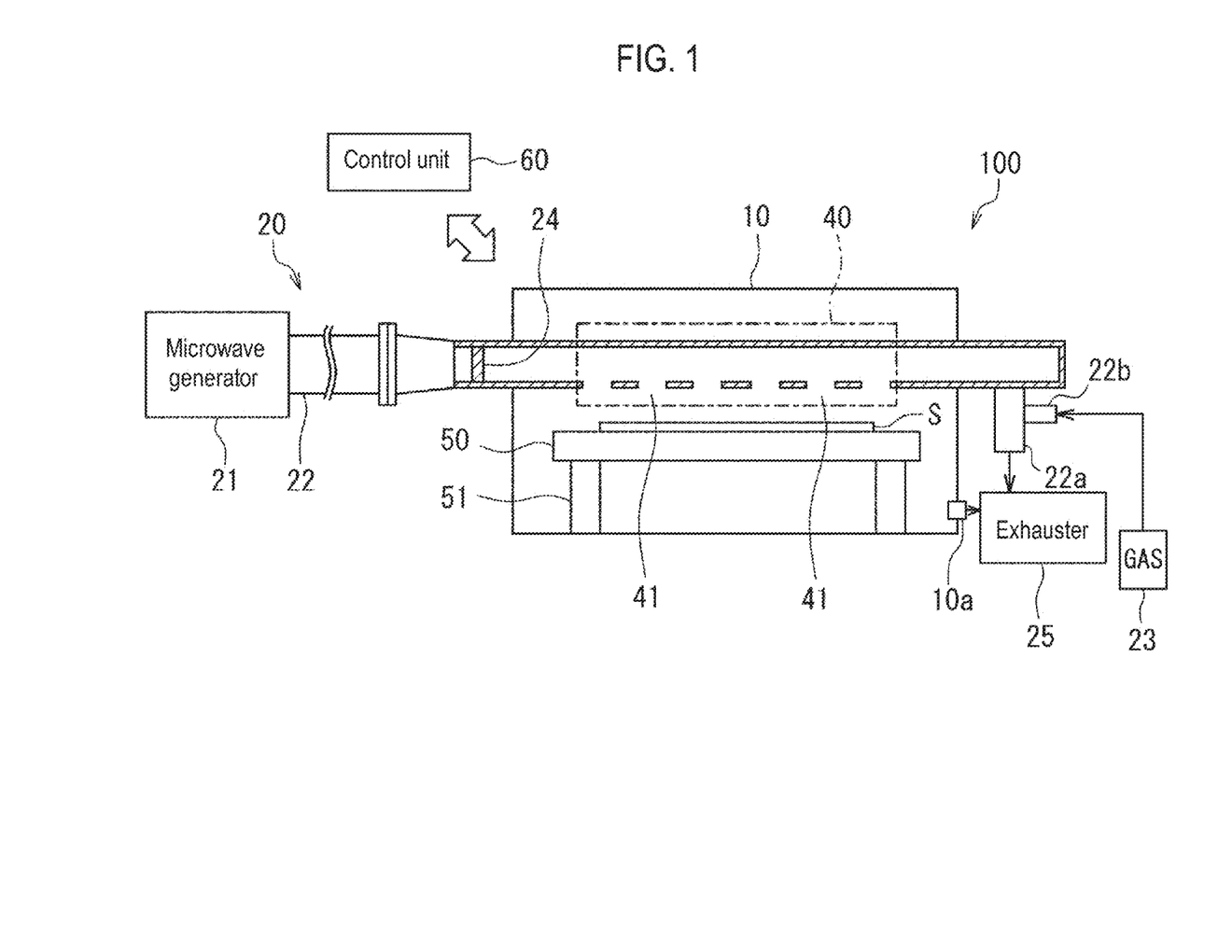
- FIG. 1 is a schematic view showing a configuration of a plasma processing apparatus according to a first embodiment of the present disclosure.

FIG. 1 is a schematic view showing a configuration of a plasma processing apparatus 100 according to one embodiment of the present disclosure. Referring to FIG. 1, a plasma processing apparatus 100 includes a processing container 10, a plasma generator 20 which generates plasma to be emitted to an object S within the processing container 10, a stage 50 which supports the object S, and a control unit 60 which controls the plasma processing apparatus 100. Further, the plasma processing apparatus 100 is configured to process the object S under an atmospheric pressure.

<Processing Container>

The processing container 10 is a container for partitioning a plasma processing space and may be made of a metal such as aluminum, stainless steel or the like. Preferably, the interior of the processing container 10 is subjected to surface treatment to increase plasma erosion-resistance, such as alumite treatment. An opening (not shown) for carrying the object S in/out of the processing container 10 is formed in the processing container 10. In addition, in the plasma processing apparatus 100 according to this embodiment, which is an atmospheric pressure plasma processing apparatus, the processing container 10 is not necessary but optional.

<Plasma Generator>

The plasma generator 20 includes a microwave generator 21 which generates a microwave, a rectangular wave guide 22 connected to the microwave generator 21, a gas feeder 23 connected to the rectangular wave guide 22 for feeding process gas into the wave guide 22, and an exhauster 25 which exhausts gas within an antenna unit 40 and, if necessary, gas within the processing container 10. In addition, within the rectangular wave guide 22 is arranged a partition 24 made of a dielectric such as quartz or the like for shutting off the process gas. In addition, on one wall of the rectangular wave guide 22 is provided the antenna unit 40 which has slots 41 formed thereon and emits the plasma generated in the slots 41 toward the object S outside of the slots 41.

(Microwave Generator)

Figure 2:
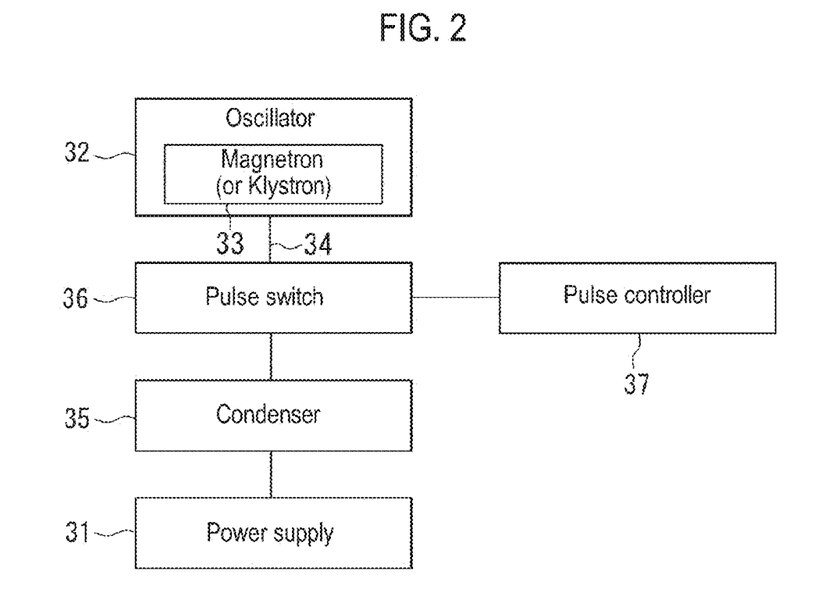
FIG. 2 is a view showing an exemplary configuration of a microwave generator.

The microwave generator 21 generates a microwave having a frequency of, for example, 2.45 GHz to 100 GHz, preferably 2.45 GHz to 10 GHz. In this embodiment, the microwave generator 21 has a pulse oscillating function to generate a pulsed microwave. FIG. 2 shows exemplary configuration of the microwave generator 21. In the microwave generator 21, a condenser 35 and a pulse switch 36 are provided on a high voltage line 34 connecting from a power supply 31 to a magnetron (or klystron) 33 of an oscillator 32. In addition, a pulse controller 37 is connected to the pulse switch 36 that inputs a control signal to control a frequency, a duty ratio, and the like. Upon receiving an instruction from a controller 61 (which will be described later) of the control unit 60, the pulse controller 37 outputs a control signal to the pulse switch 36. Then, as the control signal is input to the pulse switch 36 while a high voltage is being applied from the power supply 31, a square wave having a predetermined voltage is supplied to the magnetron (or klystron) 33 of the oscillator 32 which then outputs a pulsed microwave. A pulse of this microwave may be controlled with, for example, pulse ON time of 10 to 50 μs, pulse OFF time of 200 to 500 μs, and a duty ratio of 5 to 70%, preferably 10 to 50%. In addition, in this embodiment, the pulse oscillating function is provided to avoid transition from low temperature non-equilibrium discharging to arc discharging since heat is likely to be stored in the antenna unit 40 in continuous dischargings. If a separate cooling mechanism for the antenna unit 40 is provided, the pulse oscillating function is not necessary but optional.

The microwave generated in the microwave generator 21 is configured to be transmitted to the antenna unit 40 of the rectangular wave guide 22 via an isolator (not shown) which controls a traveling direction of the microwave or a matching device (not shown) which provides an impedance matching of the wave guide.

(Wave Guide)

The rectangular wave guide 22 is elongated in the transmission direction of the microwave and has a section with a rectangular hollow shape in a direction perpendicular to the microwave transmission direction. The rectangular wave guide 22 is made of, for example, a metal such as copper, aluminum, iron, stainless steel, or an alloy thereof.

The rectangular wave guide 22 includes the antenna unit 40. The antenna unit 40 has one or more slots 41 formed on a wall constituting a short side in a section of the antenna unit 40. That is, the antenna unit 40 is a part of the rectangular wave guide 22 and has the slots 41 formed thereon. As shown in FIG. 1, the antenna unit 40 is indicated by an alternating long and short dash line. The length of the antenna unit 40 may depend on the size of the object S to be processed and is preferably 0.3 to 1.5 m, for example. The slots 41 are openings which penetrate through the wall constituting the short side in the section of the antenna unit 40. The slots 41 are formed to face the object S so that plasma is emitted towards the object S. Arrangement and shape of the slots 41 will be described later.

In this embodiment, the plasma generator 20 includes the partition 24 which is placed within the rectangular wave guide 22 between the microwave generator 21 and the antenna unit 40 and shuts off the process gas. The partition 24 is made of a dielectric material such as quartz, a dipolytetrafluoroethylene such as Teflon®, or the like, and is used to prevent the process gas within the rectangular wave guide 22 from flowing toward the microwave generator 21 while allowing the microwave to pass through the rectangular wave guide 22.

(Gas Feeder)

The gas feeder (GAS) 23 is connected to a gas inlet 22b provided in a branch pipe 22a branched from the rectangular wave guide 22. The gas feeder 23 includes a gas source, a valve, a flow rate controller and so on (all of which are not shown). The gas source may be provided for each type of gas. An example of the process gas may include hydrogen, nitrogen, oxygen, vapor, fluorocarbon ($CF_4$) gas or the like. The fluorocarbon ($CF_4$) gas may also require an exhauster 25. Further, a source of inert gas such as argon, helium, nitrogen or the like may be provided. The process gas fed from the gas feeder 23 into the rectangular wave guide 22 is plasmarized by discharging produced in the slots 41 by the microwave.

(Exhauster)

The exhauster 25 includes a valve, a turbo molecule pump or a dry pump, and so on (all of which are not shown). The exhauster 25 is connected to the branch pipe 22a of the rectangular wave guide 22 and an exhaust hole 10a of the processing container 10 for exhausting gas out of the rectangular wave guide 22 and the processing container 10. For example, process gas left in the rectangular wave guide 22 at the time of process stop may be promptly removed by actuating the exhauster 25. In addition, the exhauster 25 is used to efficiently replace atmospheric gas existing within the rectangular wave guide 22 and the processing container 10 with the process gas at the time of initiating discharging. In the plasma processing apparatus 100 according to this embodiment, which is an atmospheric pressure plasma processing apparatus, the exhauster 25 is not necessary but optional. However, it is preferable to provide the exhauster 25 if the process gas is a gas such as $CF_4$ gas having a possibility to generate highly-reactive fluorine radicals (F) or fluorocarbon radicals (CxFy) by plasmarization although it is stable at room temperature.

<Stage>

The stage 50 supports the object S horizontally within the processing container 10. The stage 50 is configured to be supported by a support 51 provided at the bottom of the processing container 10. The stage 50 and the support 51 may be made of, for example, quartz, a ceramic material such as AlN, $Al_2O_3$, BN or the like, or a metal material such as Al, stainless steel or the like. Further, if necessary, a heater may be buried in the stage 50 to heat the object S up to, for example, 250° C. In addition, in the plasma processing apparatus 100 according to this embodiment, the stage 50 may be optional and thus, may be provided depending on the type of the object S.

<Object to be Processed>

The plasma processing apparatus 100 may target, as the object S to be processed, a flat panel display (FPD) substrate representing a glass substrate for a liquid crystal display (LCD), or a film member such as a polysilicon film or a polyimide film to be adhered to the FPD substrate. Further, the plasma processing apparatus 100 may perform surface cleaning, surface treatment or the like for a film member such as a polyethyleneterephtalate (PET), polyethylenenaphtalate (PEN) or the like in order to form active elements such as organic semiconductor devices, and passive elements. In addition, for example, the plasma processing apparatus 100 may be used for modification of a thin film formed on the FPD substrate, and also surface treatment, cleaning, modification, or the like, of the film member that are performed in order to increase adhesion of the thin film to the FPD substrate. In this manner, the plasma processing apparatus 100 can process the object S having a relatively large size efficiently.

<Control Unit>

Figure 3:
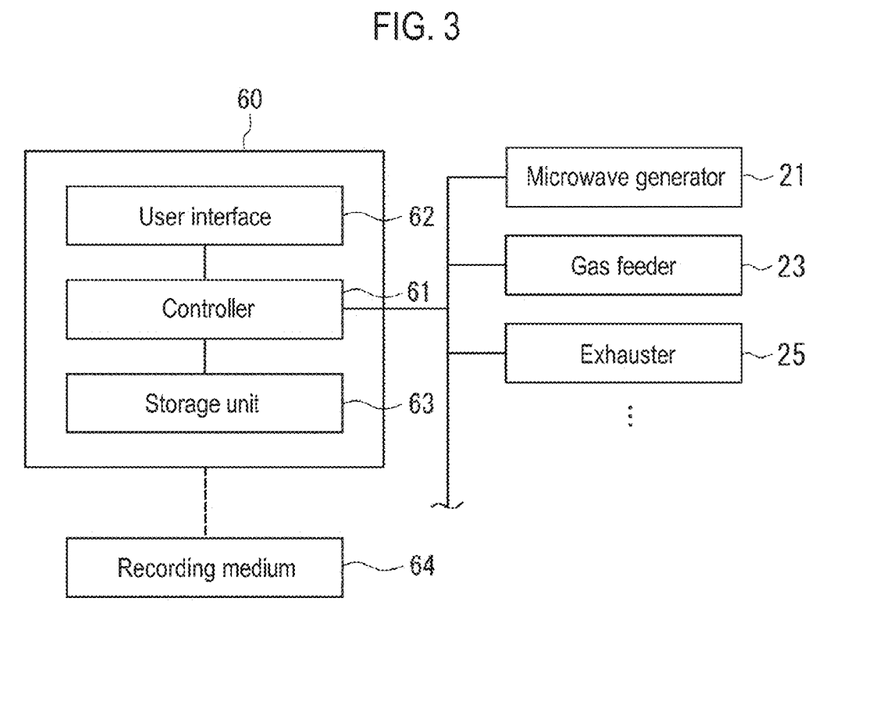
FIG. 3 is a view showing an exemplary configuration of a control unit.

Various components constituting the plasma processing apparatus 100 are connected to and controlled by the control unit 60. As shown in FIG. 3, the control unit 60 having computing capability includes a controller 61 having a CPU, an user interface 62 connected to the controller 61, and a storage unit 63. In the storage unit 63, there are stored recipes having control programs (software) to be executed by the controller 61 to implement various processes performed in the plasma processing apparatus and related process condition data. If necessary, by reading any control program or recipe from the storage unit 63 according to an instruction from the user interface 62 and executing it by means of the controller 61, the plasma processing apparatus 100 may perform a desired process under the control of the control unit 60. In addition, the recipes such as the control program and process condition data may be used by installing those stored in a computer readable recording medium 64 in the storage unit 63. The computer readable recording medium 64 is not particularly limited but an example thereof may include a CD-ROM, a hard disk, a flexible disk, a flash memory, a DVD or the like. Alternatively, the recipes may be downloaded online from other apparatuses via, for example, a dedicated line.

<Configuration of Slot>

Next, arrangement and shape of the slots 41 in the antenna unit 40 will be described in detail by way of example with reference to FIG. 4A to FIG. 12. The arrangement and shape of the slots 41 are preferably designed to generate plasma in most of the opening (preferably the entire surface of the opening) of the slots 41. A combination of arrangement and shape of the slots 41 is important for generating plasma in most of the opening of the slots 41. From this standpoint, a preferred aspect of arrangement and shape of the slots 41 will be now described.

Figure 4A:
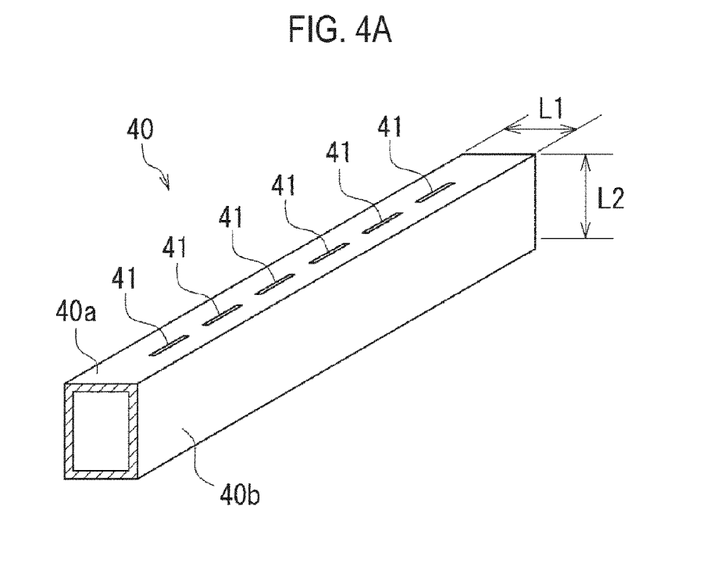
FIG. 4A is a perspective view used to explain slots of an antenna unit of a wave guide.
Figure 4B:
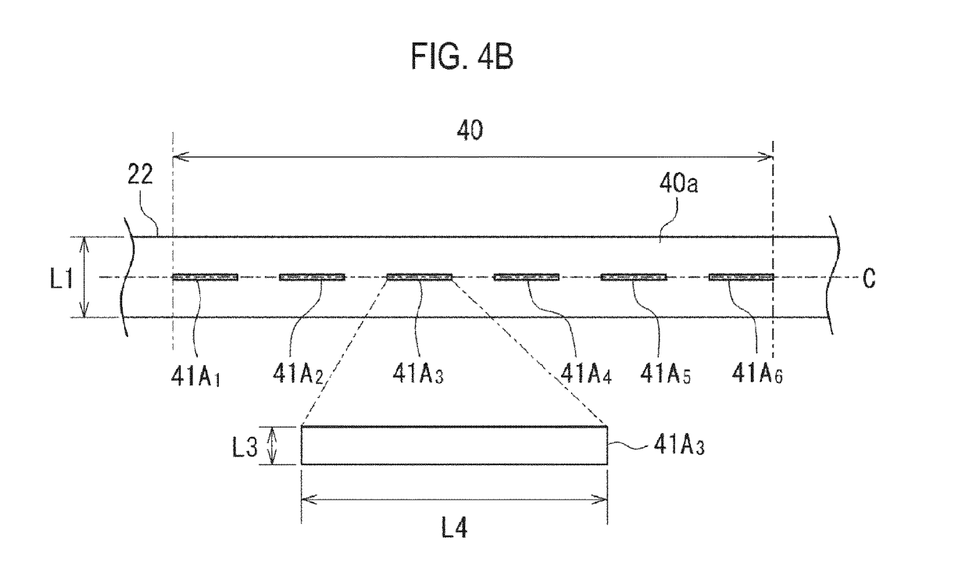
FIG. 4B is a plane view of a surface having the slots formed in FIG. 4A.
Figure 5A:
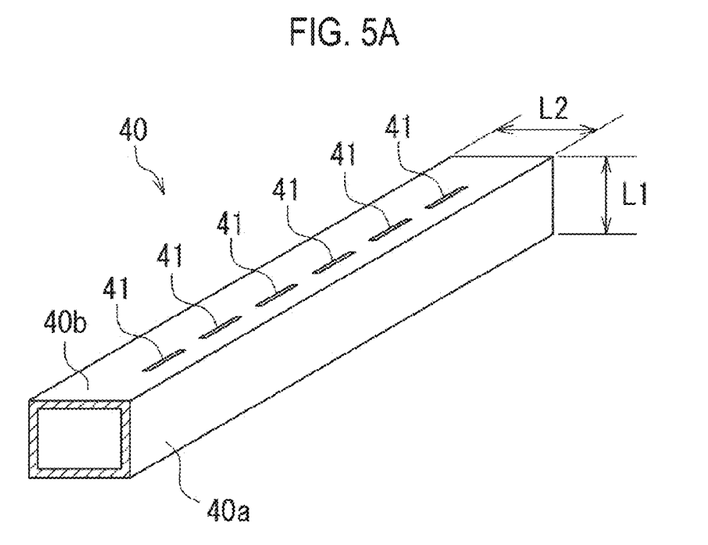
FIG. 5A is a perspective view used to explain an example of a different arrangement of slots of the antenna unit of the wave guide.
Figure 5B:
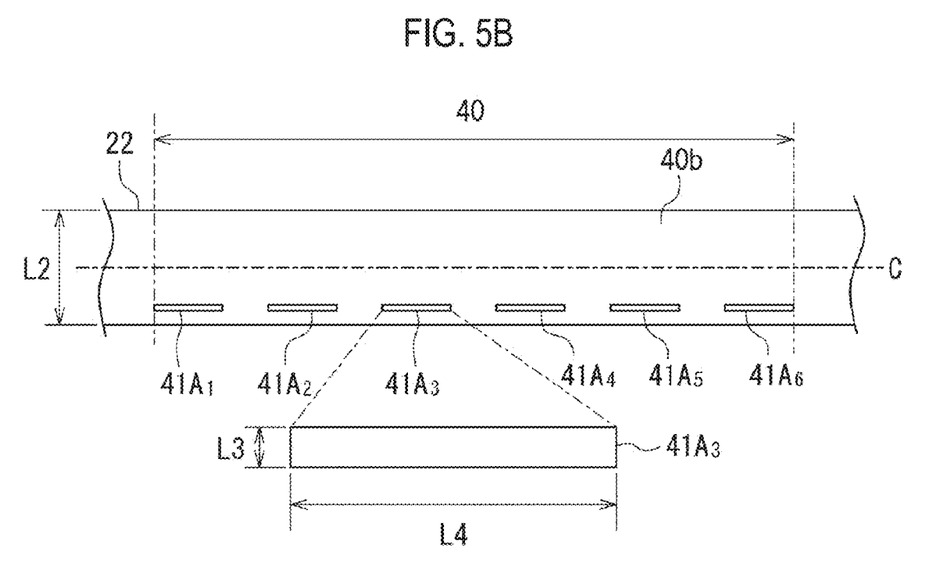
FIG. 5B is a plane view of a surface having the slots formed in FIG. 5A.

FIGS. 4A, 4B, 5A and 5B show six (6) rectangular slots 41 formed on one wall 40a or 40b constituting the antenna unit 40. FIG. 4A shows a surface (wall 40a) having the slots 41 formed in the antenna 40 of the rectangular wave guide 22, with the surface directing upward. FIG. 4B is a plane view of the wall 40a shown in FIG. 4A. FIG. 5A shows a surface (wall 40b) having the slots 41 formed in the antenna 40 of the rectangular wave guide 22, with the surface directing upward. FIG. 5B is a plane view of the wall 40b shown in FIG. 5A. In the plasma processing apparatus 100, the wall 40a or 40b on which the slots 41 are arranged is disposed to face the object S.

As shown in FIGS. 4A, 4B, 5A and 5B, the slots 41 are preferably disposed on the wall 40a constituting the short side in the section of the antenna unit 40 although they may be disposed on either the wall 40a constituting the short side or the wall 40b constituting the long side. That is, assuming that the width of the short side in the section of the antenna unit 40 is L1 and the width of the long side therein is L2 (i.e., L1<L2), it is preferable to dispose the slots 41 on the wall 40a constituting the short side having the width of L1, as shown in FIGS. 4A and 4B. An electric wave of the microwave arrives at an end of the rectangular wave guide 22 while being reflected between a pair of wall 40a constituting the short side of the rectangular wave guide 22 and is reflected from the end so as to form a standing wave as it travels in a direction reverse to the original traveling direction within the rectangular wave guide 22. A magnetic wave perpendicular to the electric wave travels while being reflected between a pair of wall 40b constituting the long side of the rectangular wave guide 22 and is reflected from the end of the rectangular wave guide 22 so as to form a magnetic standing wave as it travels in a direction reverse to the traveling direction. In this manner, the microwave enters the antenna unit 40 which is a part of the rectangular wave guide 22 so that it forms a standing wave. When the slots 41 are formed at valleys of the electric wave of the standing wave, it is possible to produce strong plasma. When the slots 41 are formed on the wall 40a constituting the short side, a surface current flowing through the wall 40a flows perpendicular to the wall 40b constituting the long side. As a result, as long as the slots 41 are in parallel to the lengthwise direction of the antenna 40, wherever the slots 41 are formed in the wall 40a, the surface current can flow in perpendicular to the slots 41 to obtain strong plasma. However, for the purpose of simplification of design, it is preferable that the slots 41 are formed near the center of the wall 40a constituting the short side [near a line C (center line) connecting the center of the widthwise direction of the wall 40a in the lengthwise direction of the wave guide].

Meanwhile, as shown in FIGS. 5A and 5B, it is also possible to form the slots 41 in the wall 40b constituting the long side. In such a case, it is effective to form the slots 41 at valleys of the magnetic wave in order to form strong plasma. According to an estimation on the electromagnetic field of the rectangular wave guide 22, an electric field is strengthened near the pair of walls 40a constituting the short side so strong plasma can be obtained by forming the slots near both sides of the wall 40a rather than the center of the wall 40b. Accordingly, as shown in FIGS. 5A and 5B, the slots 41 are formed at a position deviated from the line C (center line) connecting the center of the widthwise direction of the wall 40a constituting the long side in the lengthwise direction of the wave guide.

In FIGS. 4B and 5B, six rectangular slots 41 formed in the wall 40a or 40b of the antenna 40 are denoted by reference numerals $41A_1$ to $41A_6$. In FIGS. 4B and 5B, a portion between an end of the left outermost slot $41A_1$ and an end of the right outermost slot $41A_6$ forms the antenna 40. Preferably, an interval of the arrangement of the slots $41A_1$ to $41A_6$ arranged in series is determined based on a wavelength in the wave guide. It is preferable to decrease an interval between adjacent slots 41 in order to emit high-density plasma.

In addition, although each slot $41A_1$ to $41A_6$ does not need to have any specific values in length and width, it is preferably narrow and elongated. Assuming that a width of the short side of the rectangular slots 41 is L3 and a length of the long side thereof is L4, it is preferable that the length L4 of the long side of the rectangular slots 41 is set to be less than a half wavelength of the standing wave within the rectangular wave guide 22 from a standpoint of reducing energy loss and emitting high-density plasma. In addition, in an experiment made by the present inventors, an intensive electric field and hence high-density plasma were obtained when the width L3 of the slots 41 was as small as possible. Specifically, L3 is preferably equal to or less than 0.3 mm.

The slots 41 are preferably arranged such that their lengthwise direction coincides with and is in parallel to the lengthwise direction of the antenna unit 40 (that is, the lengthwise direction of the rectangular wave guide 22). If the lengthwise direction of the slots 41 is not in parallel to and is angled with respect to the lengthwise direction of the antenna unit 40, since the slots 41 traverse the valleys of the electric field, the valleys of the strong electric field cannot be effectively used and it is difficult to build up plasma over the entire opening of the slots 41.

Figure 11:
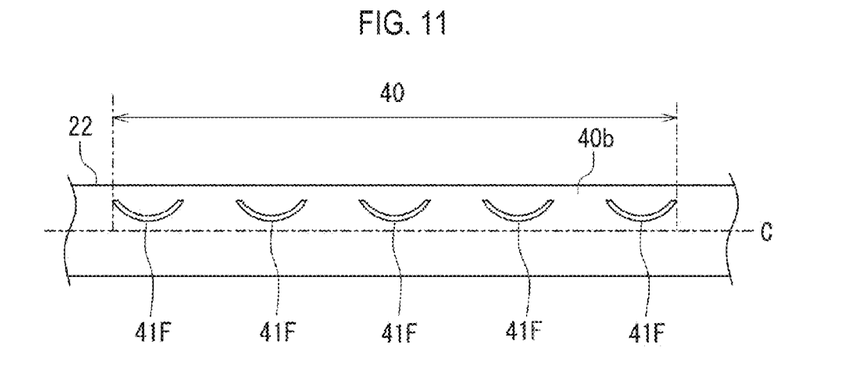
FIG. 11 is a view showing another example of an arrangement of slots.
Figure 12:
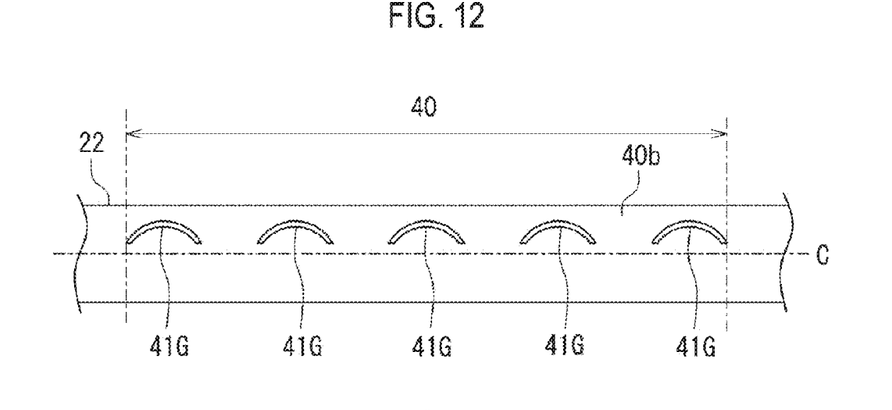
FIG. 12 is a view showing another example of an arrangement of slots.

In addition, as shown in FIG. 5A and FIG. 5B, when the slots 41 are formed on the wall 40b constituting the long side, since a surface current flows radially from valleys of a magnetic field, it is also effective to make the slots 41 in an arc shape such that the radially flowing surface current is incident at a right angle to the slots 41 in order to traverse the constant surface current over the entire opening of the slots 41 (see FIG. 11 and FIG. 12). In such a case, it is effective to arrange the arc-shaped slots 41 to be convex (FIG. 11) or concave (FIG. 12) with respect to the central line C of the wall 40b. However, when the slots 41 are formed on the wall 40b constituting the long side, it is difficult to expand plasma over the entire slots 41 and form uniform plasma, as compared to when the slots 41 are formed on the wall 40a constituting the short side.

Figure 6A:
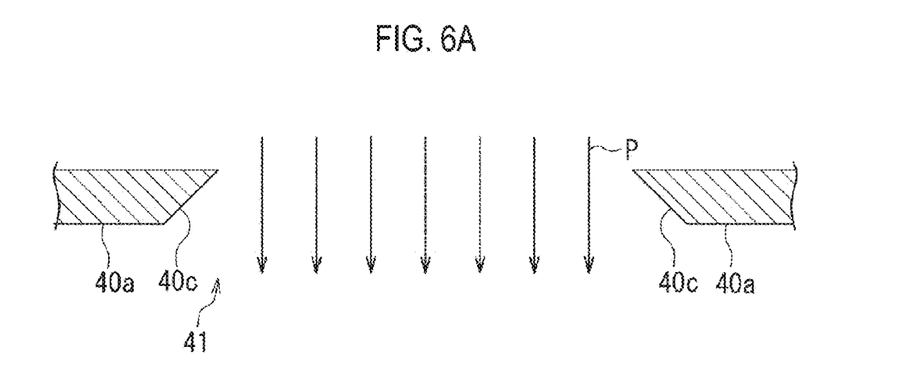
FIG. 6A is a view used to explain one example of a sectional shape of slots.
Figure 6B:
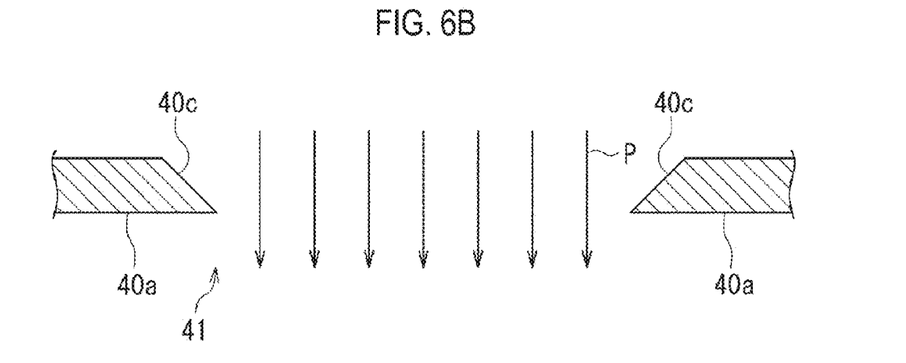
FIG. 6B is a view used to explain another example of a sectional shape of slots.

Further, as shown in FIG. 6A, it is preferable that an edge 40c of the opening of the slot 41 is formed to be inclined such that the opening is widened outwards in the thickness direction of the wall 40a. When the edge 40c of the slot 41 is formed to be inclined, the width L3 of the opening of the slot 41 in the inner wall of the rectangular wave guide 22 can be shortened, thereby reducing power of initiating discharging, decreasing energy loss and generating high-density plasma. In addition, in FIG. 6A, reference numeral P denotes plasma emitted from the slot 41 schematically. On the other hand, as shown in FIG. 6B, if the opening width of an outer side of the rectangular wave guide 22 is narrower than that of an inner side thereof (that is, if an inclination reverse to that of FIG. 6A is provided), this would not obtain plasma having density as high as that of FIG. 6A although it would provide an effect of expanding a discharging area.

The slots 41 may be embodied into various conventional shapes and arrangements. In the case of a wave guide antenna, since it uses a standing wave of the microwave formed within the rectangular wave guide 22 when the microwave is introduced into the rectangular wave guide 22, it is preferable to form the slots 41 in valleys of the standing wave in order to generate strong plasma. In addition, it is efficient to set the length of the slots 41 to be equal to or less than a half wavelength of the standing wave in order to form strong plasma in the slots 41. When the slots 41 are formed in peaks of the standing wave, no plasma is formed in the slots 41 due to a weak electromagnetic field. In this manner, when the wave guide antenna is used, since no plasma or weak plasma reaches peaks of the standing wave formed within the rectangular wave guide 22, it is preferable to provide a structure where a plurality of rows of slots is arranged within one rectangular wave guide 22 or a plurality of rectangular wave guides 22 provided with one row of slots arranged in parallel so as to make up for the peaks of the microwave generated within one rectangular wave guide 22 with the row(s) of the slots of different rectangular wave guides 22.

The plurality of slots 41 may be arranged in a row or in plural rows. When the slots 41 are formed on the wall 40a constituting the short side of the rectangular wave guide 22, since a surface current flowing through the surface of the wall 40a flows usually in a direction perpendicular to the center axis of the lengthwise direction of the wave guide in the wall 40a constituting the short side, the slots 41 should be preferably formed in parallel to the center axis of the lengthwise direction of the wave guide in the wall 40a constituting the short side. In addition, it is preferable to arrange the slots 41 at a position of valleys of the standing wave in the lengthwise direction of the wave guide; however, in principle, the slots 41 may be arranged anywhere in the short side direction perpendicular to the wave guide lengthwise direction. However, in the respect of workability and use convenience, it is preferable to form the slots 41 near the center line C of the wall 40a constituting the short side.

On the other hand, when the slots 41 are formed on the surface of the wall 40b constituting the long side of the rectangular wave guide 22, it is preferable to form rectangular slots 41 in valleys of the standing wave generated within the rectangular wave guide 22 to obtain strong plasma. In such a case, an electromagnetic field becomes maximal at valleys of the standing wave, and a surface current flowing through the wall 40b constituting the long side flows from the valleys toward the wall 40a constituting the short side and increases as it approaches the wall 40a of the rectangular wave guide 22. Accordingly, by forming the rectangular slots 41 on the wall 40b constituting the long side and near the wall 40a constituting the short side of the rectangular wave guide 22, strong plasma can be generated in the rectangular slots 41.

Figure 7:
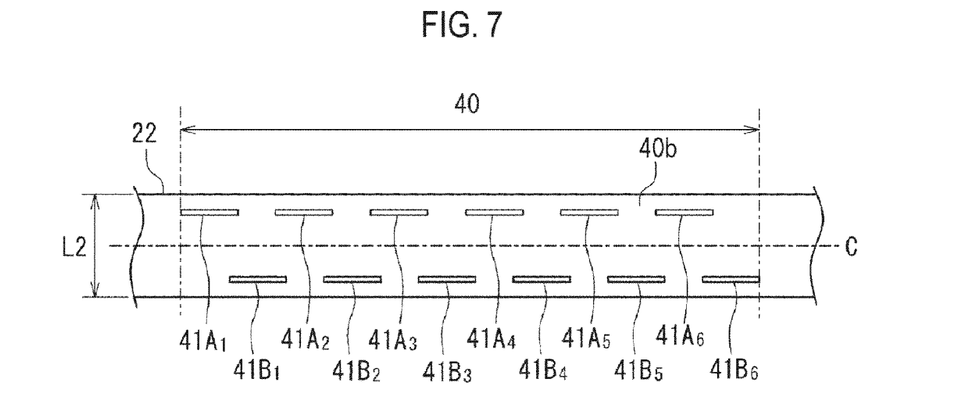
FIG. 7 is a view showing an example of an arrangement of slots.

FIG. 7 shows an example of an arrangement of two or more rows of rectangular slots 41. In FIG. 7, two rows of six rectangular slots 41 are linearly arranged on the wall 40b of the antenna unit 40. That is, in FIG. 7, one set of slots $41A_1$ to $41A_6$ is linearly arranged in a row and another set of slots $41B_1$ to $41B_6$ is linearly arranged in a row. In FIG. 7, a portion between an end of the left outermost slot $41A_1$ and an end of the right outermost slot $41B_6$ forms the antenna 40. The number of rows of slots 41 is not limited to two but may be three or more.

As shown in FIG. 7, when two or more rows of slots 41 are arranged, from a standpoint of reducing energy loss and emitting high-density plasma, it is preferable to arrange the slots 41 to be dislocated in the lengthwise direction such that at least one slot 41 exists in the widthwise direction of the wall 40b constituting the long side in the antenna unit 40. For example, in FIG. 7, slot $41B_1$ is in an adjacent row in the widthwise direction of the antenna unit 40 between the slots $41A_1$ and $41A_2$ belonging to the same row. Further, $41A_2$ is in an adjacent row in the widthwise direction of the antenna unit 40 between the slots $41B_1$ and $41B_2$ belonging to the same row. In this manner, it is preferable to arrange the slots 41 such that a surface current traversing the inside of the wall 40b constituting the long side of the antenna unit 40 in the widthwise direction necessarily crosses one slot 41.

Figure 8:
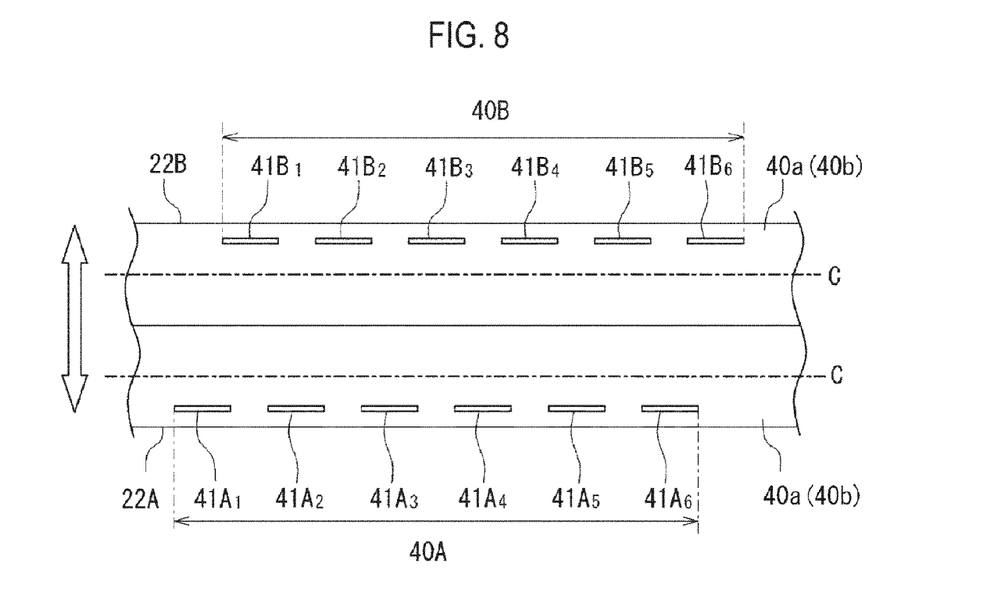
FIG. 8 is a view showing another example of an arrangement of slots.

FIG. 8 shows parallel arrangement of two rectangular wave guides 22A and 22B and their two antenna units 40A and 40B. A plurality of slots 41 is arranged in a row in each antenna unit 40A and 40B. One set of slots $41A_1$ to $41A_6$ is linearly arranged in a row in the antenna unit 40A and another set of slots $41B_1$ to $41B_6$ is linearly arranged in a row in the antenna unit 40B. In FIG. 8, slots $41A_1$ to $41A_6$ and $41B_1$ to $41B_6$ are arranged to be dislocated in the lengthwise direction to make up for each other for each antenna unit 40A and 40B such that at least one slot 41 exists across the two antenna units 40A and 40B in the widthwise direction (indicated by an arrow in the figure) of the wall 40a constituting the short side or the wall 40b constituting the long side.

In addition, in the examples of FIG. 7 and FIG. 8, it is preferable that the slots 41 are arranged at a position deviated from the center of the wall 40a or 40b in the widthwise direction. For example, in FIG. 7, the slots 41 are formed at a position deviated from the central line C of the wall 40b constituting the long side in the widthwise direction. In this manner, by forming the rows of slots 41 deviated from the central line, it is possible to maximize the surface current flowing through the wall 40b constituting the long side, thereby achieving reduction of energy loss and emission of high-density plasma. In addition, in FIG. 8, the slots 41 are formed at a position deviated from the central line C of the wall 40a constituting the short side or the wall 40b constituting the long side in the widthwise direction. In this manner, by forming the rows of slots 41 deviated from the central line, it is possible to maximize the surface current flowing through the wall 40a (or 40b), thereby achieving reduction of energy loss and emission of high-density plasma.

Figure 9:
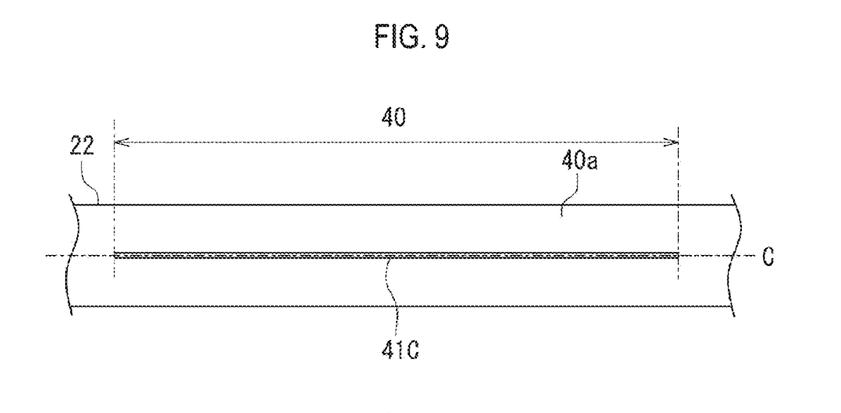
FIG. 9 is a view showing another example of an arrangement of slots.

In addition, when the slots 41 are formed on the wall 40a constituting the short side or the wall 40b constituting the long side, a single long slot 41 may be arranged over the entire region of the antenna unit 40. For example, FIG. 9 shows an example of a single long linear slot 41C formed in the antenna unit 40 near the center axis of the wall 40a constituting the short side. In FIG. 9, since a length of a range in which the slot 41C is formed is equal to the length of the antenna unit 40, the slot 41C exists over the entire region of the antenna unit 40 in the widthwise direction of the wall 40a constituting the short side.

Figure 10:
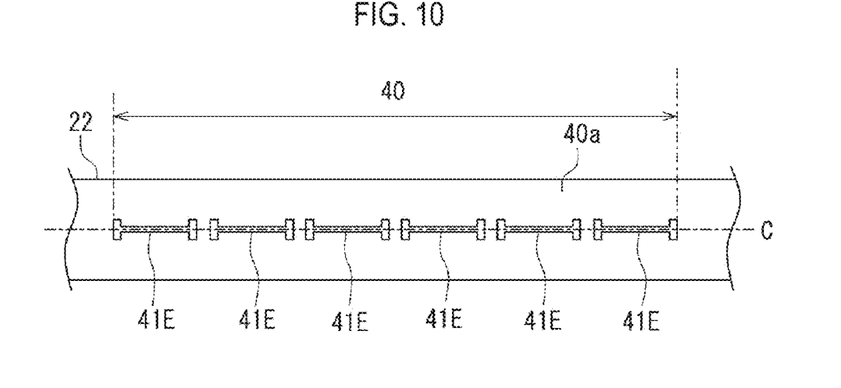
FIG. 10 is a view showing another example of an arrangement of slots.

FIG. 10 to FIG. 12 shows other examples of the slots 41. FIG. 10 shows an example of a linear arrangement of H-shaped slots 41E. Since the H-shaped slots 41E have respective rectangular short openings intersecting each other at a right angle at both ends of rectangular long openings, a surface current generated in the inside of the wall 40a (within the rectangular wave guide 22) of the antenna unit 40 can traverse the slots 41E effectively. For example, assuming that rectangular slots 41 are formed on the wall 40a constituting the short side of the rectangular wave guide 22, it is preferable to form the rectangular slots 41 near the central line C of the wall 40a constituting the short side, as described earlier. A surface current permeates into the rectangular slots 41 at a right angle to form a strong electric field within the rectangular slots 41 to generate plasma. At this time, at an end of the long side of the rectangular slots 41, the surface current is more likely to enter peripheral portions having lower resistance rather than permeating into the rectangular slots 41 at a right angle. As a result, plasma density may decrease at the end of the long side of the rectangular slots 41. In extreme cases, no plasma is formed at the end of the long side of the rectangular slots 41. The present inventors have discovered that the H-shaped slots 41E shown in FIG. 10 are effective to avoid such a phenomenon. A surface current permeating into the end of the long side of the H-shaped slots 41E at a right angle may be prevented from flowing into peripheral regions having low resistance due to short rectangular openings formed in both ends of the H-shaped slots 41E. As a result, the surface current permeates into the slots 41E at a right angle. This ensures that reduction of plasma density or extinction of plasma, which was exhibited in the end of the long side of the rectangular slots 41, is not produced. In this manner, because of their H shape, the H-shaped slots 41E can suppress the phenomenon that the surface current detours the opening near the slots 41E. Accordingly, an electric field is more likely to be formed even in peripheral regions of the end of the long side of the slots 41E, which can expand a discharging region and generate high-density plasma efficiently as compared with the simple rectangular (square) slots 41.

FIG. 11 and FIG. 12 show examples of arc-shaped slots 41 formed on the wall 40*b* constituting the long side of the rectangular wave guide 22. FIG. 11 shows an example of arc-shaped slots 41F formed in a convex form toward the central line C of the wall 40*b* of the antenna unit 40. FIG. 12 shows an example of arc-shaped slots 41G formed in a convex form toward the outer side of the wall 40*b* of the antenna unit 40. Even in the case of arc-shaped slots 41F and 41G, a radial surface current generated in the inside of the wall 40*b* (within the rectangular wave guide 22) of the antenna unit 40 can traverse openings of the slots 41F and 41G with constant density. Accordingly, an electric field is more likely to be formed in the vicinity of the slots 41F and 41G, which can expand a discharging region and generate high-density plasma efficiently. In addition, in the case of the arc-shaped slots 41F and 41G shown in FIG. 11 and FIG. 12, a lengthwise direction connecting two ends of an arc coincides with the lengthwise direction of the antenna unit 40.

In addition, even in the examples of FIG. 9 to FIG. 12, when the slots 41 are formed on the wall 40*a* constituting the short side of the rectangular wave guide 22, it is preferable to arrange the slots 41 near the central line C of the wall 40*a* constituting the short side. When the slots 41 are formed on the wall 40*b* constituting the long side of the rectangular wave guide 22, it is preferable to arrange the slots 41 near the wall 40*a* constituting the short side (that is, at a position deviated from the central line C of the wall 40*b* constituting the long side in the widthwise direction). Further, in the examples of FIG. 9 to FIG. 12, a plurality of rows of slots 41 may be arranged. In addition, although the examples of FIG. 10 to FIG. 12 shows six slots 41 formed in a row, the number of slots 41 is not particularly limited.

Next, operation of the plasma processing apparatus 100 will be described. First, the object S is carried into the processing container 10 and is loaded onto the stage 50. Then, a predetermined flow rate of process gas is introduced from the gas feeder 23 into the rectangular wave guide 22 via the gas inlet 22*b* and the branch pipe 22*a*. The introduction of the process gas into the rectangular wave guide 22 allows the internal pressure of the rectangular wave guide 22 to be higher than the atmospheric pressure.

Next, the microwave generator 21 is powered ON to generate a microwave. At this time, the microwave may be generated in a pulse shape. The microwave is introduced into the rectangular wave guide 22 via the matching circuit (not shown). The introduced microwave causes an electromagnetic field within the rectangular wave guide 22 and plasmarizes the process gas fed into the rectangular wave guide 22 in the slots 41 of the antenna unit 40. The plasma is emitted from the antenna unit 40 of the rectangular wave guide 22 having a relatively higher pressure toward the object S outside via the slots 41. In the plasma processing apparatus 100 according to this embodiment, a measurement was made at a position of the slots 41 under conditions of argon (Ar) dilute 0.4 to 1.0% hydrogen gas as the process gas, a flow rate of 50 L/min and microwave power of 1.5 kW, and a measurement was made at a position 7 mm immediately below the slots 41 with electron density of $1\times10^{14}$ to $1\times10^{16}$/cm$^3$. As a result, high density plasma with hydrogen radical density of $1\times10^{14}$ to $1\times10^{15}$/cm$^3$ could be generated. Accordingly, an efficient plasma process can be implemented by applying this high-density plasma to the object S.

In addition, plasma was generated under conditions of a 10 L/min (slm) flow rate of argon dilute 1% hydrogen gas and microwave power of 1.5 kW, and hydrogen radical density was measured using vacuum ultraviolet absorption spectroscopy. As a result of this measurement, the hydrogen radical density was $2\times10^{14}$/cm$^3$ at a position 7 mm immediately below the antenna unit. From the dependency of the hydrogen radical density on a distance from the antenna unit, it could be seen that high-density plasma having hydrogen density of about $1\times10^{16}$/cm$^3$ was generated in the slot 41.

Meanwhile, plasma was generated under conditions of argon 14 slm (standard condition liter/min), mixed gas of hydrogen flow rate of 100 sccm (standard condition cc/min) and nitrogen flow rate of 100 sccm (standard condition cc/min), microwave frequency of 10 GHz, microwave pulse ON time of 10 to 50 μs, microwave pulse OFF time of 200 to 500 μs and net microwave power of 1.2 to 1.6 kW. In addition, a quartz plate was placed at a position 22 mm immediately below the slots, light was captured using an optical fiber, and the electron density of the slots was estimated from Hβ Stark amplification of hydrogen atom emission. The estimated electron density was $1.5\times10^{15}$ to $1.7\times10^{15}$/cm$^3$ which shows formation of high-density plasma.

As described above, since the plasma generator 20 and the plasma processing apparatus 100 including the same according to this embodiment are atmospheric pressure plasma apparatuses requiring no vacuum container, there is no need to provide a dielectric plate between the rectangular wave guide 22 and the object S, which may prevent an energy loss by absorption of the microwave in the dielectric plate. Further, since the plasma generator 20 and the plasma processing apparatus 100 are atmospheric pressure plasma apparatuses, they can be simply configured without requiring any pressure-resistant vacuum container, seal mechanism and so on. In addition, in order to increase substitution efficiency of the process gas, a decompressible exhausting equipment and a mechanism to discharge atmospheric pressure plasma to a closed space may be provided.

In addition, the plasma generator 20 and the plasma processing apparatus 100 including the same according to this embodiment require no dedicated gas introduction mechanism since the process gas fed into the rectangular wave guide 22 is plasmarized in the slots 41 by means of the microwave and is discharged out of the slots 41. Thus, this may result in a decrease in the size of the apparatus. That is, since the rectangular wave guide 22 plays a role of a shower head, there is no need to provide a gas introduction mechanism such as a separate shower head and a separate shower ring, and may result in a simplified configuration of the apparatus. In addition, since the microwave is applied to the process gas within the rectangular wave guide 22, it is possible to emit uniform plasma to the object S.

Next, examples performed using the same plasma processing apparatus as that shown in FIG. 1 will be described.

First Example

Surface Treatment of Polyimide Film

An antenna unit where a row of 41 rectangular slots is linearly arranged along the central line of a wall constituting a short side of a rectangular wave guide when a microwave frequency of 10 GHz was used. Plasma was generated by microwave discharging by means of a microwave generator having a frequency of 10 GHz and power of 1.6 kW under the conditions of pulse modulator ON time and OFF time of 30 µs, respectively, and argon gas of 14 L/min (slm). At this time, a polyimide film as a sample was placed at a position 4 mm immediately below the antenna unit and was treated for 0 to 60 seconds. Antenna net power during treatment was 1.56 kW. A water contact angle of an untreated polyimide film (treatment time of 0 second) and a treated polyimide film (treatment time of 4 seconds) was examined to have changed from 70° to 18°. The untreated polyimide film was hydrophobic and, after it was subjected to the plasma treatment, its water contact angle was significantly reduced to 18° and its surface was modified to be hydrophilic. In addition, a treatment effect was weakened when the polyimide film and a slot-formed surface of the antenna unit are separated from each other by a distance. In particular, if the distance is equal to or more than 20 mm, the treatment effect was sharply weakened.

Second Example

Reduction of Copper Oxide

A test was performed as follows using plasma generated under the conditions of argon 14 slm (standard condition liter/min), mixed gas of hydrogen flow rate of 100 sccm (standard condition cc/min) and nitrogen flow rate of 140 sccm (standard condition cc/min), microwave frequency of 10 GHz, microwave pulse ON time of 10 to 50 µs, microwave pulse OFF time of 200 to 500 µs and net microwave power of 1.2 to 1.6 kW. Plasma treatment was carried out for 30 seconds to 15 minutes with a CuOx film, which was formed at a film thickness of about 20 nm by subjecting a copper (Cu) film formed by sputtering to thermal oxidation, placed at a position 4 mm immediately below the rectangular slots. As a result, it could be confirmed that CuOx was being reduced from the position immediately below the slots as the deep purple color of CuOx was changed to the copper color of Cu. It was inferred from the foregoing that hydrogen atoms generated in plasma removes O in CuOx and a surface of metal copper appears.

Second Embodiment

Figure 13:
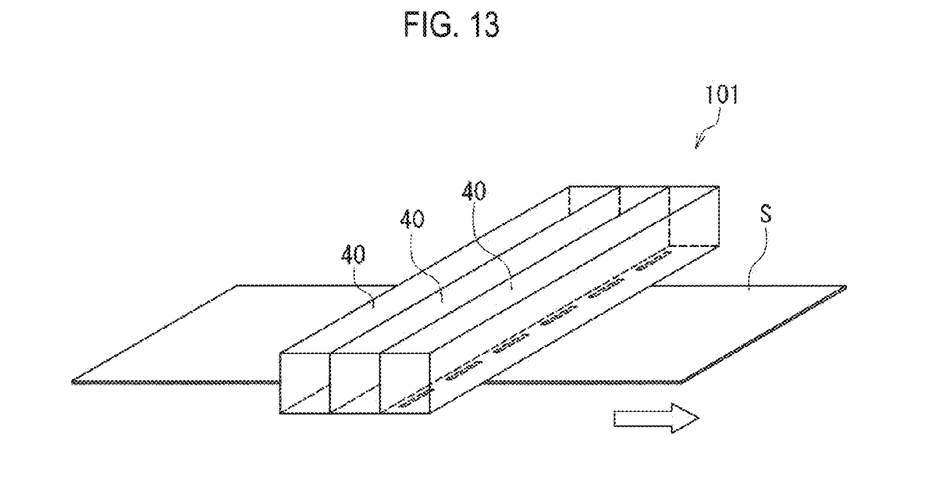
FIG. 13 is an explanatory view showing an example of a configuration of a plasma processing apparatus in which a plurality of antenna units of a wave guide is arranged in parallel.

Next, a plasma processing apparatus according to a second embodiment of the present disclosure will be described with reference to FIG. 13 to FIG. 15. FIG. 13 shows an example of a configuration of a plasma processing apparatus 101 where a plurality of (three in FIG. 13) antenna units 40 of the rectangular wave guide 22 is arranged in parallel. In the plasma processing apparatus 101, an object S is provided to be moved relative to the antenna units 40 in a direction indicated by an arrow in FIG. 13 by means of a driving mechanism (not shown). The lengthwise direction of the antenna units 40 (the rectangular wave guide 22) is perpendicular to the movement direction of the object S. Slots 41 of the antenna units 40 are arranged to be longer than the width of the object S. As shown in FIG. 13, by arranging the plurality of antenna units 40 in parallel and relatively moving the object S, it is possible to perform a continuous uniform plasma process for the object S without process irregularity. Since a plasma generator 20 including the antenna units 40 has the same configuration as that of the first embodiment, explanation on details thereof will not be repeated. The number of antenna units 40 arranged in parallel is not limited to three but may be two or four or more.

Figure 14:
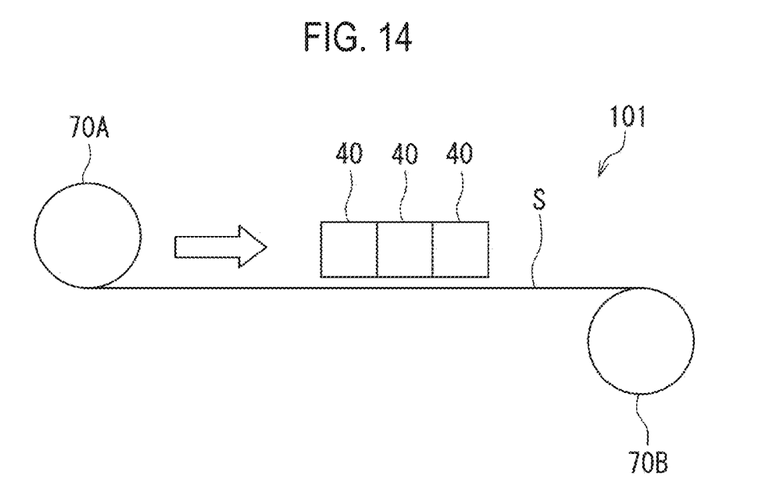
FIG. 14 is an explanatory view showing an example of a configuration of a plasma processing apparatus which carries an object to be processed in a roll-to-roll manner.

FIG. 14 shows a case where a long sheet-like (film-like) object S is processed while being carried in a roll-to-roll manner in the plasma processing apparatus 101. The object S is delivered from a first roll 70A and is wound on a second roll 70B. In this manner, the plasma processing apparatus 101 according to this embodiment can be used to easily perform a continuous process in the case where the object S has a sheet shape (film shape) which can be wound.

Figure 15:
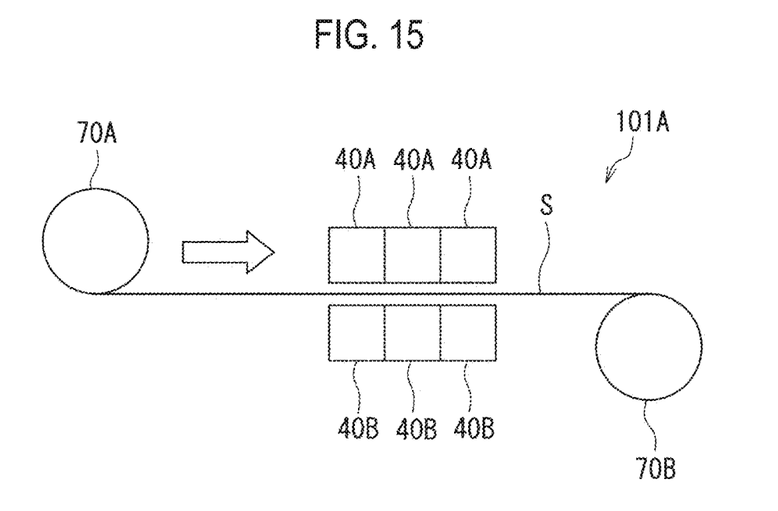
FIG. 15 is an explanatory view showing another example of a configuration of a plasma processing apparatus which carries an object to be processed in a roll-to-roll manner.

FIG. 15 shows a modification of FIG. 14. In the plasma processing apparatus 101A of FIG. 15, three antenna units 40 are vertically arranged in parallel so that an object S is interposed therebetween. The antenna units 40A arranged above the object S have slots 41 formed in the bottom (surface facing the object S) of the units. The antenna units 40B arranged below the object S have slots 41 formed in the top (surface facing the object S) of the units. In this manner, by arranging the antenna units 40 on both top and bottom sides of the object S, a plasma process can be simultaneously performed for both sides while carrying the object S in the roll-to-roll manner.

Since the plasma generator and the plasma processing apparatus of the present disclosure are atmospheric pressure plasma apparatuses requiring no vacuum container, there is no need to provide a dielectric plate between the rectangular wave guide and the object, which may prevent an energy loss by absorption of the microwave in the dielectric plate. In addition, the plasma generator and the plasma processing apparatus of the present disclosure can generate high-density plasma efficiently to plasmarize the process gas fed into the wave guide using the microwave and discharge the plasma out of the slots. There is no need to provide a dedicated gas introduction mechanism, which may result in a decrease in size of the apparatus. Accordingly, the plasma generator and the plasma processing apparatus of the present disclosure can be used to perform a plasma process for the object using high-density plasma while suppressing an energy loss to the maximum.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. For example, although in the disclosed embodiments the object S has been illustrated with a FPD substrate, a film adhered to the FPD substrate, etc., the object S is not particularly limited but may be, for example, a substrate such as a semiconductor substrate or the like. The accompanying claims and their equivalents are intended to cover such forms or modifications as would fall within the scope and spirit of the disclosures.

What is claimed is:

1. An apparatus for generating plasma, comprising:
   a microwave generator configured to generate a microwave;
   a wave guide which is connected to the microwave generator, wherein the waveguide is elongated in a traveling direction of the microwave and has a hollow shape having a rectangular section in a direction perpendicular to the traveling direction;
   a gas feeder which is connected to the wave guide and feeds process gas into the rectangular section of the wave guide; and
   an antenna unit which is a part of the wave guide and discharges plasma generated by the microwave to the outside, wherein the antenna unit has one or more slots formed on a wall constituting a short side in a section of the antenna unit, creates plasma from the process gas fed into the wave guide under an atmospheric pressure in the slots by the microwave, and discharges the plasma out of the slots.

2. The apparatus of claim 1, wherein a partition to shut off the process gas is placed within the wave guide between the microwave generator and the antenna unit.

3. The apparatus of claim 1, wherein the slots have a rectangular shape and are arranged in such a manner that the lengthwise direction of the slots coincides with the lengthwise direction of the antenna unit.

4. The apparatus of claim 3, wherein a plurality of slots is arranged in a row.

5. The apparatus of claim 3, wherein a single slot is formed in the antenna unit.

6. The apparatus of claim 1, wherein an edge of the slots is inclined to change an opening width in the thickness direction of the wall.

7. The apparatus of claim 1, further comprising a pulse generator to generate a pulsed microwave to generate plasma.

8. The apparatus of claim 1, wherein a plurality of antenna units is arranged in parallel.

9. The apparatus of claim 8, wherein, in the plurality of antenna units arranged in parallel, the slots are arranged with the slots dislocated in the lengthwise direction every antenna unit such that at least one slot exists in the widthwise direction of the wall over the plurality of antenna units.

10. An apparatus for plasma processing, comprising the apparatus of claim 1, wherein the generated plasma is used to perform a predetermined process for an object to be processed.

11. The apparatus of claim 10, wherein the antenna unit is arranged such that the slots face the object to be processed.

12. The apparatus of claim 11, wherein the antenna unit is arranged in both top and bottom surfaces of the object to be processed.

13. The apparatus of claim 11, wherein the object to be processed has a film shape and is provided to be carried in a roll-to-roll manner.

14. A method for plasma processing which processes an object to be processed using the apparatus of claim 10.

15. The apparatus of claim 1, wherein inert gas is further fed to the waveguide.

16. The apparatus of claim 1, wherein the process gas is hydrogen gas, water vapor, or fluorocarbon ($CF_4$) gas.

17. The apparatus of claim 15, wherein the inert gas includes argon, helium, or nitrogen gas.

18. An apparatus for plasma processing, comprising the apparatus of claim 1, wherein an exhauster is connected to the wave guide and a processing container.

* * * * *